(12) United States Patent
Pyo

(10) Patent No.: US 6,846,364 B2
(45) Date of Patent: Jan. 25, 2005

(54) HEATER BLOCK HAVING CATALYST SPRAY MEANS

(75) Inventor: Sung Gyu Pyo, Ichon (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 778 days.

(21) Appl. No.: 09/879,204

(22) Filed: Jun. 13, 2001

(65) Prior Publication Data

US 2002/0014204 A1 Feb. 7, 2002

(30) Foreign Application Priority Data

Jun. 13, 2000 (KR) ............................... 2000-32397

(51) Int. Cl.[7] ..................... H01L 21/00; C23C 16/00
(52) U.S. Cl. ................ 118/725; 118/728; 118/715; 156/345.52
(58) Field of Search ...................... 118/715, 725, 118/728; 156/345.51, 345.52

(56) References Cited

U.S. PATENT DOCUMENTS 5,192,370 A * 3/1993 Oda et al. ............... 118/715
5,772,771 A * 6/1998 Li et al. .................. 118/715

FOREIGN PATENT DOCUMENTS

| JP | 9-181065 | 7/1997 |
|---|---|---|
| KR | 97-0077163 | 12/1997 |

* cited by examiner

*Primary Examiner*—Hien Tran
(74) *Attorney, Agent, or Firm*—Finnegan, Henderson, Farabow, Garrett & Dunner, L.L.P.

(57) ABSTRACT

A heater block installed within a chamber in the chemical vapor deposition (CVD) apparatus used to manufacture a semiconductor device is described. The heater block includes a catalyst spraying device comprising a support section, an upper plate coupled to an upper portion of the support section and having a projection section at an edge of the upper plate, and a heater installed at prominences and depressions of the upper plate formed of the projection section and constructed so that a wafer can be located on an upper portion of the upper plate. Catalyst is supplied through passages formed within the support section and the upper plate and is uniformly sprayed onto a surface of the wafer via a plurality of spray holes formed at the projection section.

8 Claims, 1 Drawing Sheet

HEATER BLOCK HAVING CATALYST SPRAY MEANS

BACKGROUND OF THE INVENTION

1. Field of the Invention

The invention relates generally to a heater block installed within a chamber in chemical vapor deposition (CVD) apparatus used to manufacture a semiconductor device. More particularly, the present invention relates to a heater block having a catalyst spray means.

2. Description of the Prior Art

Generally, a metal wiring in a semiconductor device is formed of aluminum (Al), tungsten (W), titanium (Ti), etc. These metals are deposited by means of physical vapor deposition (PVD) or chemical vapor deposition (CVD) methods. Of them, the CVD method is a method by which a metal precursor in a gaseous state is sprayed onto the surface of a wafer, so that the metal is deposited on a wafer due to chemical reaction of the precursor. These processes are performed within the chamber in the CVD apparatus.

Within the chamber of the CVD apparatus is installed a showerhead for uniformly spraying the precursor in a gaseous state supplied from a precursor delivery apparatus onto the surface of the wafer. At the bottom of the showerhead, that is, at the bottom of the chamber is installed a heater block for maintaining the wafer at an adequate temperature during the deposition process.

With the integration level and speed of semiconductor devices becoming higher, however, there is a limitation in the coverage and the burial characteristics of metal. Therefore, as time goes on, it is difficult to use the above-mentioned metals, therefore copper (Cu) is increasingly used as a new metal wiring material.

However, if Cu is deposited using CVD apparatus, as constructed above, the adhesive force and the quality of the film become degraded, lowering the electrical characteristic of devices and severely lowering the deposition speed, thus lowering the yield of devices.

In order to increase the deposition speed while improving the film quality of Cu, it is useful that a catalyst made of a chemical additive (enhancer) be uniformly sprayed on the surface of the wafer. In a conventional chamber, however, there is not an apparatus for spraying catalyst. Therefore, it is difficult to increase the deposition speed and improve the film quality of Cu.

SUMMARY OF THE INVENTION

The features of the present invention include providing a heater block having a catalyst spray means capable of overcoming the above-mentioned problems, and which can uniformly spray catalyst onto the surface of a wafer during the deposition process.

In order to accomplish the above, a heater block including a catalyst spray according to the present invention comprises an upper plate coupled to an upper portion of the support section and includes a projection section at the edge of the upper plate; and a heater installed at prominences and depressions of the upper plate formed of the projection section and constructed so that a wafer can be located on an upper portion of the upper plate, wherein catalyst supplied through passages formed within the support section and the upper plate is uniformly sprayed onto the surface of the wafer via a plurality of spray holes formed at the projection section.

Also, a heater block including a catalyst spray means according to the present invention comprises a support section within which a first passage is formed; an upper plate coupled to an upper portion of the support section, and includes a plurality of second passages connected to the first passage, a third passage having a projection section at the edge of the upper plate and also connected to the second passage within the projection section, and a plurality of spray holes for spraying a catalyst, supplied into the third passage, outward from the projection section; and In addition, the first passage is connected to a mass flow controller for controlling the flow amount of the catalyst. The second passages are arranged in a radial shape.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1:
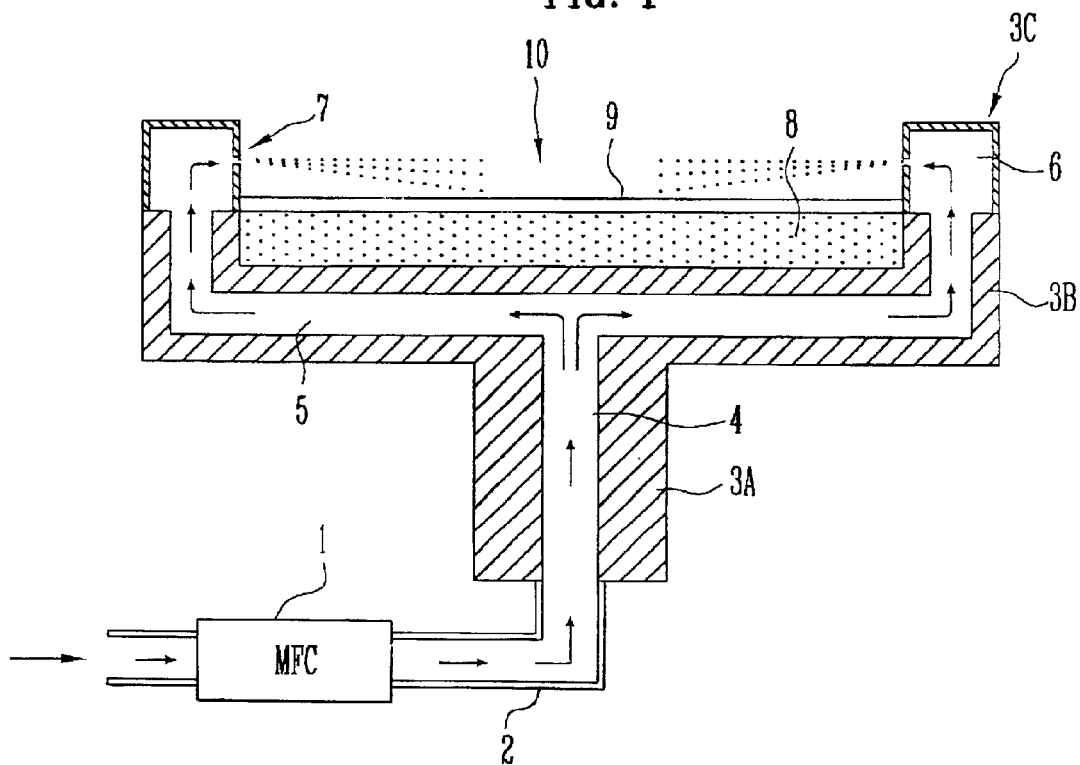
FIG. 1 is a cross-sectional view of a heater block according to the present invention.

Referring now to FIG. 1, a heater block according to the present invention will be explained.

An upper plate 3B is coupled to an upper portion of a support section 3A within which a first passage 4 is formed. A plurality of second passages 5, connected to the first passage 4, are formed within the upper plate 3B. A projection section 3C is formed at the edge of the upper plate 3B, so that prominences and depressions 10 are formed at the center of the upper plate 3B. Also, a third passage 6, connected to the second passages 5, is formed within the projection section 3C. A plurality of spray holes 7 are formed in the projection section 3C so that the catalyst, supplied into the third passage 6, can be sprayed toward the prominences and depressions 10. A heater 8, which is constructed so that the wafer 9 can be positioned on the heater 8, is installed in the prominences and depressions 10 of the upper plate 3B consisting of the projection section 3C.

Figure 2:
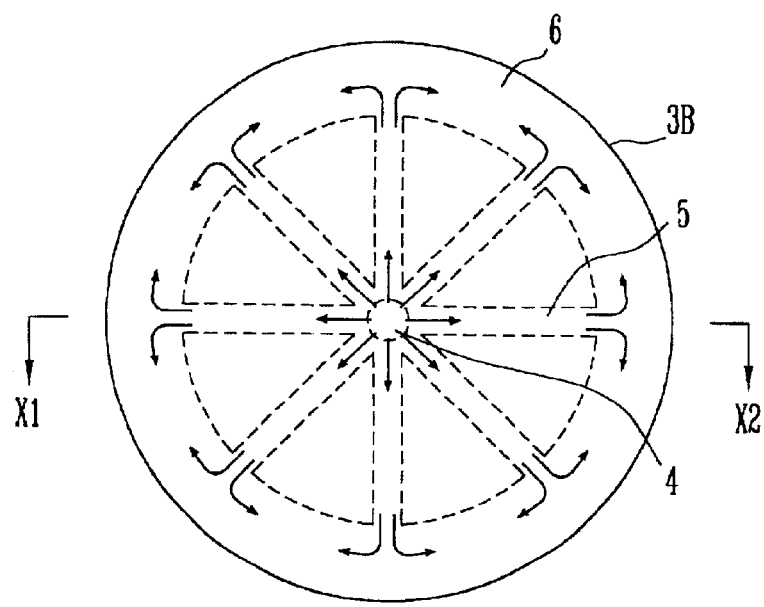
FIG. 2 is a plan view of an upper plate shown in FIG. 1.

Here, the second passages 5 are arranged in a radial shape, as shown in FIG. 2 and the number of the second passages 5 are between approximately about 4 and 32. The diameter of each of the passages 5 is 1 to 20 mm. Also, the projection section 3C is formed at a higher position than the wafer 9. Also, the projection section 3C includes spray holes 7 having a number of about 16 to 128 and formed at a spray angle of 0° to 60° downward. The diameter of each of the spray holes 7 is 0.1 to 10 mm.

For reference, FIG. 1 shows a cross-sectional view of the heater block taken along sections XI to X2 in FIG. 2.

After the heater block, constructed above, is installed within the chamber in the chemical vapor deposition (CVD) apparatus, a catalyst supply tube 2 for supplying catalyst into the first passage 4 from the outside is connected. Then, a mass flow controller 1 is installed at a given portion of the catalyst supply tube 2, so that the flow amount of the catalyst can be constantly maintained. Next, the catalyst, supplied into the third passage 6 through the first and second passages 4 and 5, circulates within the third passage 6 as shown in FIG. 2 and is then sprayed onto the surface of the wafer 9 via the spray holes 7.

If a chemical enhanced (CE) CVD method for spraying catalyst onto the surface of the wafer before depositing metal is used, a single metal such as Cu, Ag, Au, Pt, W, Ta, Ti, Al, Ru; an oxide material or a nitride material of a single metal; or an oxy-nitride material can be deposited. The catalyst used can be pure iodine (I), iodine (I) containing compound, that is, liquid or gas of F, Cl, Br, I, At, that are group-7 elements in the periodic table. H(hfac)½H$_2$O, H(hfac), TMVS can also be used. Also, the spray time of the catalyst is 1 second to 10 minutes and the chemical process is performed at the temperature of −20 to 300° C.

As mentioned above, the present invention has a catalyst spray means for uniformly spraying the catalyst installed at the heater block. As such, the present invention can improve an electrical characteristic of devices since adhesion force and film quality of the metal to be deposited can be improved. Also, it can increase the yield of devices since the deposition speed can be increased.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A heater block having a catalyst spray means, comprising:

a support section;

an upper plate coupled to an upper portion of said support section and having a projection section at an edge of the upper plate; and a heater installed at prominences and depressions of said upper plate and constructed so that a wafer can be located adjacent to an upper portion of said upper plate, wherein catalyst supplied through passages formed within said support section and said upper plate is uniformly sprayed onto a surface of the wafer via a plurality of spray holes formed at said projection section.

2. The heater according to claim 1, wherein the number of said spray holes is between 16 and 128 and each of said spray holes is between 0.1 and 10 mm in diameter.

3. A heater block having a catalyst spray means, comprising:

a support section within which a first passage is formed;

an upper plate coupled to an upper portion of said support section, and including a plurality of second passages connected said first passage, a third passage having a projection section at an edge of said upper plate and also connected to said second passages within said projection section, and a plurality of spray holes for spraying a catalyst supplied into said third passage outward from said projection section; and a heater installed at prominences and depressions of said upper plate formed of said projection section and constructed so that a wafer can be located adjacent to an upper portion of said upper plate, wherein the catalyst, supplied from outside through said first to third passages, is uniformly sprayed onto a surface of the wafer via said spray holes.

4. The heater according to claim 3, wherein said second passages are arranged in a radial shape.

5. The heater according to claim 3, wherein the number of said spray holes is between 4 and 32 and each of said spray holes is between 1 and 20 mm in diameter.

6. The heater according to claim 3, wherein the number of said spray holes is between 16 and 128 and each of said spray holes is between 0.1 and 10 mm in diameter.

7. The heater according to claim 3, wherein said spray holes are formed at a spray angle of 0° to 60° downward.

8. The heater according to claim 3, wherein said first passage is connected to a catalyst supply tube including a mass flow controller for controlling a flow amount of the catalyst.

* * * * *